(12) United States Patent
Shields

(10) Patent No.: US 6,274,475 B1
(45) Date of Patent: Aug. 14, 2001

(54) SPECIALIZED METAL PROFILE FOR VIA LANDING AREAS

(75) Inventor: Jeffrey A. Shields, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/630,813

(22) Filed: Aug. 2, 2000

Related U.S. Application Data

(62) Division of application No. 08/992,839, filed on Dec. 18, 1997, now Pat. No. 6,114,766.

(51) Int. Cl.$^7$ ................................................ H01L 21/4763
(52) U.S. Cl. ........................ 438/622; 438/636; 438/666; 438/673
(58) Field of Search ................................. 438/622, 625, 438/627, 629, 636, 652, 666, 669, 673, 688

(56) References Cited

U.S. PATENT DOCUMENTS

| | | | |
|---|---|---|---|
| 5,506,177 | 4/1996 | Kishimoto et al. | 438/624 |
| 5,763,954 | 6/1999 | Hyakutake | 257/774 |
| 5,895,937 | 4/1999 | Su et al. | 257/59 |
| 5,969,425 | * 10/1999 | Chen et al. | 257/774 |
| 6,060,375 | * 5/2000 | Owyang et al. | 438/585 |
| 6,107,148 | * 8/2000 | Taki | 438/303 |
| 6,133,142 | * 10/2000 | Tran et al. | 438/625 |

OTHER PUBLICATIONS

Wolf, S., Silicon Processing for the VLSI Era, vol. 2, Lattice Press, 1990, pp. 189–194, 332–336.*

Amazawa, A. et al., "A 0.25 $\mu$m Via Plug Process using Selective CVD Aluminum For Multilevel Interconnection", IEDM 91, pp. 265–268.

* cited by examiner

Primary Examiner—T. N. Quach

(57) ABSTRACT

A metal feature, defined by gaps in a patterned metal layer, is formed with an inwardly tapering profile so that it is wider at the top than at the bottom. The metal feature advantageously presents a larger landing area for vias while maintaining the dimensions and intraline coupling capacitance required by design. The gaps in the patterned metal layer can be filled with a spin-on dielectric material such as spin-on glass (SOG) or hydrogen silsesquioxane (HSQ).

22 Claims, 3 Drawing Sheets

SPECIALIZED METAL PROFILE FOR VIA LANDING AREAS

This application is a divisional of application Ser. No. 08/992,839, filed Dec. 18, 1997 U.S. Pat. No. 6,114,761.

TECHNICAL FIELD

The present invention relates to, manufacturing high density, multi-metal layer semiconductor devices with a reliable interconnection pattern and, more particularly, to manufacturing high density multi-metal layer semiconductor devices with design features of 0.25 microns and under.

BACKGROUND ART

Escalating demands for high density and performance associated with ultra large scale integration require semiconductor devices with design features of 0.25 microns and under, e.g. 0.18 microns, increased transistor and circuit speeds, high reliability, and increased manufacturing throughput. The reduction of design features to 0.25 microns and under challenges the limitations of conventional interconnection technology, including conventional photolithographic, etching, and deposition techniques.

Conventional methodology for forming patterned metal layers employs a subtractive etching or etch back step as the primary metal patterning technique. Such a method involves the formation of a first dielectric layer on a semiconductor substrate, typically monocrystalline silicon, with conductive contacts formed therein for electrical connection with an active region on the semiconductor substrate, such as a source/drain region. A metal layer, such as aluminum or an aluminum alloy, is deposited on the first dielectric layer, and a photoresist mask is formed on the metal layer having a pattern corresponding to a desired conductive pattern. The metal layer is then etched through the photoresist mask to form the conductive pattern comprising metal features separated by gaps, such as a plurality of metal lines with interwiring spacings therebetween.

A second dielectric layer is then applied to fill in the gaps. For example, a dielectric material, such as spin on glass (SOG), is deposited to fill in the gaps between the metal features, and baked at a temperature of about 300° C. to about 350° C., and then cured in a vertical furnace at about 350° C. to about 400° C. for a period of time up to about one hour, depending upon the particular SOG material employed, to effect planarization. Another oxide is deposited by plasma enhanced chemical vapor deposition PEGMD), and the surface is planarized, for example, by conventional etching or chemical-mechanical polishing (CMP) planarization techniques.

As feature sizes, e.g., metal lines and interwiring spacings, shrink to 0.25 microns and below, such as 0.18 microns, it becomes increasingly difficult to satisfactorily fill in the interwiring spacings voidlessly and obtain adequate step coverage. It also becomes increasingly difficult to form a reliable interconnection structure. A through-hole is typically formed in a dielectric layer to expose an underlying metal feature, wherein the metal feature serves as a landing pad for the through-hole. Upon filling the through-hole with conductive material, such as a metal plug to form a conductive via, the bottom surface of the conductive via is in contact with the metal feature.

A conventional conductive via is illustrated in FIG. 1, wherein a first metal feature 100 of a first patterned metal layer is formed on first dielectric layer 110 and exposed by a through-hole 120 etched in a second dielectric layer 130. The first metal feature 100, which has side surfaces that taper outwardly somewhat due to etching, typically has a composite structure comprising a lower metal layer 102, e.g., titanium (Ti) or tungsten (W), an intermediate or primary conductive layer 104, e.g., aluminum (Al) or an Al alloy, and an anti-reflective coating (ARC) 106, such as titanium nitride (TiN).

Gaps between the first metal feature 100 and another metal feature 190 of the first patterned metal layer are filled with dielectric material 180, such as SOG or HDP oxide. A dielectric layer 130, such as silicon dioxide derived from tetraethyl orthosilicate (TEOS) or silane, is then former upon the first patterned metal layer, as by PECVD, and planarized, as by CMP.

In accordance with conventional practices, through-hole 120 is formed so that first metal feature 100 completely surrounds the bottom opening, thereby serving as a landing pad for the metal plug filling the through-hole 120 to form the conductive via 160. The conductive via 160 electrically connects the first metal feature 100 and a second metal feature 140, which is part of a second patterned metal layer.

The second metal feature 140 is also typically a composite structure comprising a lower metal layer 142, a primary conductive layer 144, and an ARC 146. The plug filling the through-hole 120 to form the conductive via 160 is typically formed as a composite comprising a first adhesion promoting layer 150, which is typically a refractory material, such as TiN, Ti—W, or Ti—TiN, and a primary plug filling metal 170 such as W. Metal features 100 and 140 typically comprise metal lines with interwiring spacings therebetween conventionally filled with dielectric material 180, such as SOG or HDP oxide.

The reduction of design features to the range of 0.25 microns and under requires extremely high densification. The conventional practice of forming a landing pad enclosing the bottom surface of a conductive via utilizes a significant amount of precious real estate on a semiconductor chip which is antithetic to escalating high densification requirements. In addition, it is extremely difficult to voidlessly fill through-holes having such reduced dimensions because of the extremely high aspect ratio, i.e., height to width of the through-hole. Accordingly, conventional remedial techniques comprise purposely widening the through-hole to decrease the aspect ratio. As a result, misalignment may occur wherein the bottom surface of the conductive via is not completely enclosed by the underlying metal feature. This type of via is called a "borderless via", which also conserves chip real estate.

The use of borderless vias, however, creates new problems. For example, as a result of misalignment, the SOG gap filling layer is penetrated by etching when forming a misaligned through-hole, due to the low density and poor stability of SOG. As a result of such penetration, moisture and gas accumulate, thereby increasing the resistance of the interconnection. Moreover, spiking can occur, i.e., penetration of the metal plug to the substrate causing a short. Referring to FIG. 2, first dielectric layer 210 is formed on a substrate (not shown) and a first metal pattern comprising a first metal feature 200, e.g. a metal line, comprising anti-reflective coating 206, is formed on first dielectric layer 210. Gaps, such as the gap between the first metal feature 200 and another metal feature 290, are filled with SOG 280. Dielectric layer 230 is then deposited and a misaligned through-hole 220 formed therein exposing a portion of the upper surface and at least a portion of a side surface of first metal feature 200, and penetrating into and exposing a portion of SOG layer 280. Upon filling the through-hole 220 with a metallic plug 260, typically comprising an initial barrier layer 250 and tungsten 270, a spike 222 is formed.

Alternatively, SOG may be replaced by hydrogen silsesquioxane (HSQ), which offers several advantages. HSQ is relatively carbon free, thereby avoiding poison via problems and the need to etch back HSQ below the upper surface of the metal lines to avoid shorting. In addition, HSQ exhibits excellent planarity and is capable of gap filling interwiring spacings less than 0.15 microns employing conventional spin-on equipment. Moreover, HSQ has a relatively low dielectric constant, between 3.0 and 4.0 at 1 Mhz, compared to about 4.9 for plasma deposited $SiO_2$. A lower dielectric constant reduces parasitic, interline capacitive coupling, thereby increasing circuit speed.

HSQ, however, is susceptible to degradation during processing leading to various problems, including an increase in its dielectric constant. HSQ typically contains between about 70% and about 90% Si—H bonds. Upon exposure to an $O_2$-containing plasma when stripping tang the photoresist mask for defining a misaligned or borderless via, however, a considerable number of Si—H bonds are broken and Si—OH bonds are formed. In fact, upon treatment with an $O_2$-containing plasma, as little as about 20% to about 30% of the Si—H bonds may remain in the deposited HSQ film. It has been found that breaking the Si—H bonds results in a local increase in the dielectric constant and, consequently, the amount of intraline capacitive coupling.

Due to the problems attendant upon forming borderless vias, it is desirable to reduce the occurrence of through-hole misalignment and, hence, the number of borderless vias. If the metal feature is widened to increase the landing area for the via, misalignments can be avoided. However, there are disadvantages attendant upon widening the metal features. A conventional metal structure typically has a profile characterized by outwardly tapering side surfaces, wherein the top surface has a width smaller than the bottom surface, as illustrated in FIG. 1. For example, first metal feature 100, the top surface comprising anti-reflective coating 106 is located, can have a width of about 0.45 $\mu$m, while the bottom surface has a width of about 0.55 $\mu$m. Outwardly tapering metal structures are considered desirable to facilitate voidless gap filling, as with HDP oxide.

Increasing the width of the metal features leads to such problems as bridging, increased intraline capacitive coupling, and altered electrical dimensions. Bridging is characterized by a connection across the gap between metal structures, e.g. first metal feature 100 and a metal feature 190, and is due to incomplete etching down to the first dielectric layer 110, In this situation, an electrical connection, or a "short," may undesirably occur along the unetched metal remaining at the bottom of the gap. Generally, the smaller the gap, the greater the risk of bridging.

Intraline capacitive coupling is inversely proportional to the distance between the metal structures. Widening metal features reduces the distance between the metal features, thereby increasing the intraline capacitive coupling. Consequently, widening the metal lines and other metal features results in slower circuit speed due to the increased intraline capacitive coupling.

Another disadvantage attendant upon widening metal features is that the electrical dimensions are changed, e.g. the resistance of the lines. A changed electrical dimension may necessitate redesigning the metallization layers, thereby undesirably increasing the costs and postponing chic development.

DISCLOSURE OF THE INVENTION

There exists a need for a high-density multilevel semiconductor device with design features of 0.25 microns and under and a reliable interconnection structure. A need also exists for a method of manufacturing such a semiconductor device.

There also exists a need to minimize the number of borderless vias in a reliable interconnection structure without increasing intraline coupling capacitance between metal lines. There is also a need to form metal features having a wide ton surface without significantly altering the electrical dimensions of the metal features.

These and other needs are met by the present invention, which comprises forming metal features having inwardly tapering side surfaces, i.e. with the top surface wider than the bottom surface. Consequently, a larger landing area for vias is presented, thereby reducing the number of borderless vias without increasing intraline capacitance or substantially altering electrical dimensions.

Additional needs, objects, advantages, and other features of the present invention will be set forth in part in the description which follows and in part will become apparent to those having ordinary skill in the art upon examination of the following or may be learned from the practice of the invention. The needs, objects, and advantages of the present invention may be realized and obtained as particularly pointed out in the appended claims.

Accordingly, one aspect of the present invention is a semiconductor device comprising: a first dielectric layer formed on a substrate; a patterned metal layer having gaps, formed on the first dielectric layer and including a metal feature having a top surface, a bottom surface, and side surfaces tapering inwardly from the top surface to the bottom surface; a second dielectric layer formed on the patterned metal layer; and a through-hole having an internal surface formed in the second dielectric layer exposing a portion of the upper surface of the metal feature.

Another aspect of the present is a method of manufacturing a semiconductor device comprising: forming a first dielectric layer on a substrate; forming a patterned metal layer having gaps on the first dielectric layer, wherein the patterned metal layer comprises a metal feature having a top surface, a bottom surface, and side surfaces tapering inwardly from the top surface to the bottom surface; and forming a second dielectric layer on the patterned metal layer.

Additional needs, objects, and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Figure 1:
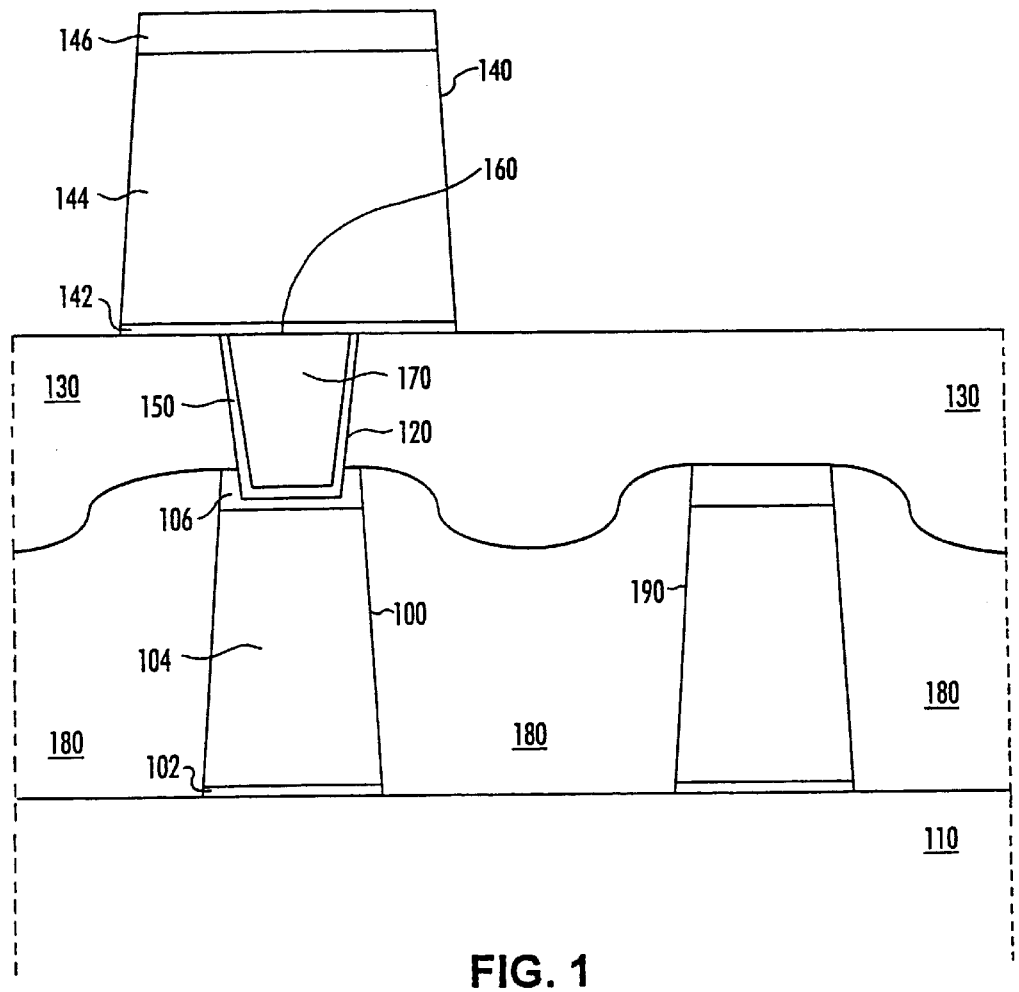
FIG. 1 schematically illustrates an aligned via on a metal structure with a conventional profile.

The present invention reduces the number of borderless vias by providing metal features, e.g. metal lines, having inwardly tapering side surfaces such that the top surface is wider than the bottom surface, thereby presenting a larger landing area for vias, so that what would otherwise be a mis-aligned via is landed. Consequently, dielectric fillers such as HSQ are not etched.

The slope of the side surfaces of the metal features formed during etching the deposited metal layer is related to the amount of polymerization that occurs during the etching. Generally, as the amount of polymer formed increases, the outward taper of the side surfaces increases. Conversely, as the amount of polymer formed decreases, the outward taper of the side surfaces decreases. The amount of polymer formation depends on variables such as the amount of reactants for a particular etching chemistry, temperature, and power. In accordance with embodiments of the present invention, etching variables are controlled to reduce the amount of polymer formation such that the resulting metal features comprise inwardly tapering side surfaces.

For example, employing $Cl_2$—$BCl_3$ chemistry for plasma etching an aluminum or an aluminum alloy metal layer, the amount of polymerization is controlled by varying the amount of additives or by varying the temperature or power at which the etching occurs. The gas additives typically include any of the following gases or mixture thereof: $CHF_3$, N, $CF_4$, $SF_6$, and HCl. In accordance with the present invention, the amount of gas additives is lowered and/or the temperature is raised to reduce the amount of polymer formation such that the resulting metal feature comprise inwardly sloping side surfaces.

Since it is generally desirable to use lower temperature processes were possible, it is preferable to control the amount of polymer formation and, hence, the slope of the metal features by lowering the amount of gas additives. The particular percentage of rate of flow used for gas additives depends on the particular patterned metal, especially on the amount of copper (Cu) alloyed with the Al. However, the percentage of gas additives will typically be less than the percentage used to obtain vertical metal features for the same etching chemistry at the same temperature. For example, employing $Cl_2$—$BCl_3$ plasma chemistry with a 15% $CHF_3$ additive, metal features are etched with substantially vertical sides surfaces; however, if the amount of $CHF_3$ additive is reduced to about 5% to about 10%, metal features having inwardly tapering side surfaces are formed.

Embodiments of the present invention include metal features having a top surface with a width of about 0.54 $\mu$m to about 0.56 $\mu$m and a bottom surface with a width of about 0.44 $\mu$m to about 0.46 $\mu$m, such that the width of the top surface is about 0.08 $\mu$m to about 0.12 $\mu$m wider than the top surface.

The degree to which the side surfaces of a metal features tapers inwardly depends on the height of the metal feature. For example, if the height of the metal feature is about 8000 Å, the inward slope as measured from the upper surface of the underlying dielectric layer is about 85.5° to about 87.5°, such as 85.7° to 87.1°. If the height of the metal feature is about 10,000 Å, the inward slope is in the range about 86° to about 88°, such as 86.6° to 87.7°.

Embodiments of the present invention comprise metal features with inverted profiles with respect to prior art metal features. Consequently, the electrical dimensions, including intraline coupling capacitances, are about the same, thereby rendering it unnecessary to redesign the interconnection circuitry.

Embodiments of the present invention include reducing the intraline coupling capacitances even further by narrowing the bottom surfaces of metal features as, for example, by reducing the width by about 0.08 $\mu$m to about 0.12 $\mu$m on each side. Such a reduction results in side surfaces sloping inwardly at about 80° to about 85° for 8,000 Å high metal features and slopes of about 83° to about 86° for 10,000 Å high metal features. In fact, the bottom surface can be reduced even narrower, subject to the constrain that the bottom surface is not completely etched so that the metal feature is lifted off the first dielectric layer. For this reason, a width for the bottom surface of the metal features of at least 0.1 $\mu$m is desired.

Since the sides of the metal features taper inwardly, it is desirable to fill the gaps with a liquid or spin-on dielectric materials to reduce void formation. Examples of such dielectric materials include spin-on glass (SOG) and hydrogen silsesquioxane (HSQ). One form of HSQ is commercially available from Dow Corning Corp. under the product name Dow Corning™ Flowable Oxide or FOx™.

Figure 3:
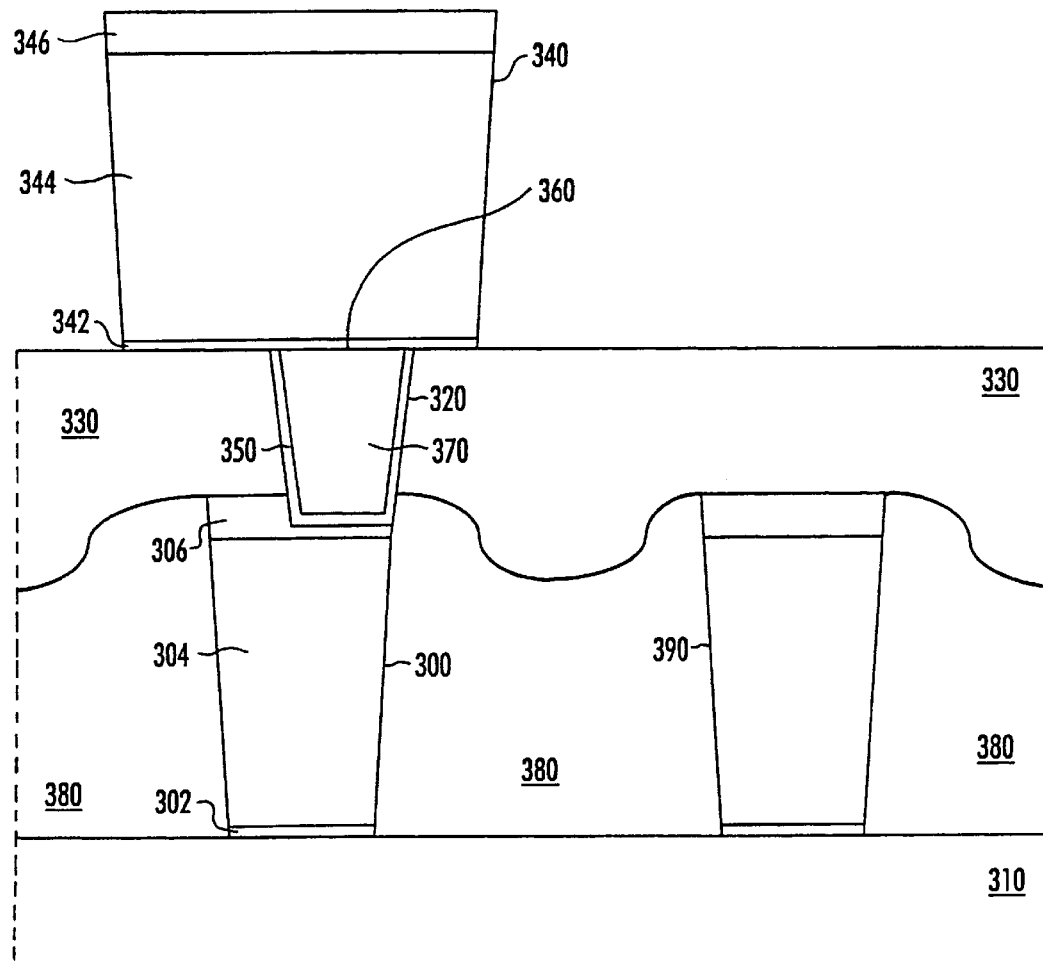
FIG. 3 schematically illustrates a via on a metal structure with a profile according to one embodiment of the present invention.

An embodiment of the present invention is schematically illustrated in FIG. 3 and comprises first metal feature 300 formed on first dielectric layer 310 which, in turn, is formed on a substrate (not shown), such as an appropriately monocrystalline doped silicon semiconductor substrate. First metal feature 300, such as a conductive line, comprises first metal layer 302, such as W or Ti, primary conductive metal layer 304, such as Al or an Al alloy, and anti-reflective coating 306, such as Ti—TiN. In accordance with the present invention, gaps are formed, as by etching employing $Cl_2$—$BCl_3$ plasma chemistry with about 5% to about 10% gas additives, so that metal features 300 and 390 have inwardly tapering side surfaces. The gaps, such as interwiring spacings on both sides of inwardly tapering first metal lines 300, are filled with dielectric material 380, such as SOG or HSQ.

Figure 2:
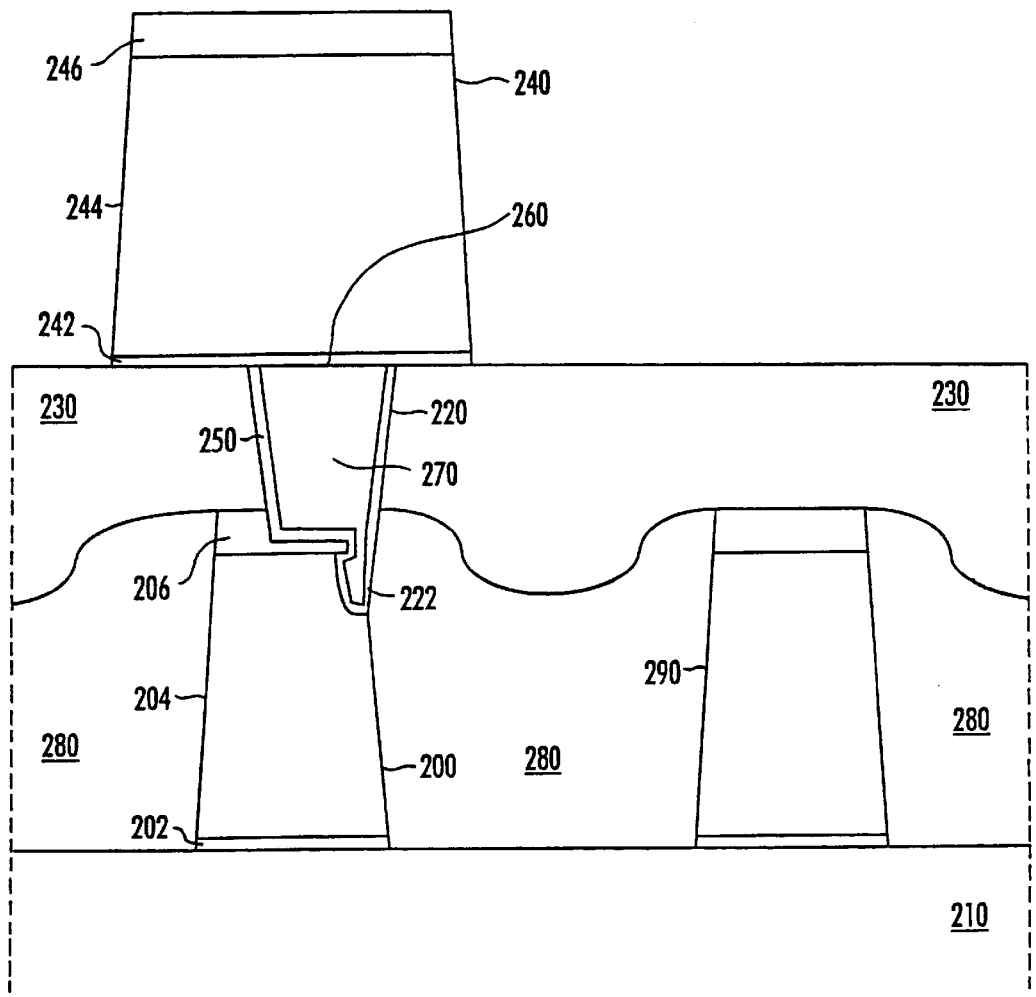
FIG. 2 schematically illustrates a mis-aligned via on a metal structure with a conventional profile.

With continued reference to FIG. 3, the profile of first metal feature 300 is inverted with respect to conventional metal feature illustrated in FIG. 2. In particular, the width of the top surface of the first metal feature 300 depicted in FIG. 3 is substantially the same as the width of the bottom of first metal feature 200 depicted in FIG. 2. Similarly, the width of the bottom surface of first metal feature 300 depicted in FIG. 3 is substantially the same as the width of the top surface of the first metal feature 200 depicted in FIG. 2. As a result, the electrical dimensions of the two implementations of the first metal feature are substantially the same as well as the intraline capacitive coupling.

With continued reference to FIG. 3, a second dielectric layer 330 is formed on the first pattern metal layer and through-hole 320 is formed in second dielectric layer 330 and anti-reflective coating 306. Through-hole 320 depicted in FIG. 3 is misaligned to about the same extent as conventional through-hole 220 shown in FIG. 2. However, since the top surface of first metal feature 300 (FIG. 3) is wider than the top surface of first metal feature 200 (FIG. 2), misalignment in the present invention (FIG. 3) does not result in the formation of a borderless via, i.e. the via formed by through-hole 320 is entirely landed on first metal feature 300. Consequently, dielectric layer 380 does not undergo etching upon etching the through-hole 320. If the dielectric 380 comprises HSQ, it is evident that a lesser number of the Si—H bonds is locally degraded in the HSQ than over the configuration illustrated in FIG. 2. Therefore, the intraline coupling capacitance in the configuration illustrated in FIG. 3 is lower than in FIG. 2, since the dielectric constant of the HSQ dielectric 380 proximate to the via is not so degraded.

A TiN layer 350 is formed, as by physical vapor deposition (PVD), e.g. sputtering, or by chemical vapor deposition (CVD), as by thermal decomposition of an organic titanium compound, such as tetrakis dimethlyamino titanium (TDMAT). In the latter case, it preferable to expose the CVD TiN barrier to an $H_2/N_2$ plasma treatment to reduce its carbon content and resistivity, as disclosed in commonly assigned, application Ser. No. 08/951,592, filed on Oct. 26, 1997, now U.S. Pat. No. 5,866,954 issued Feb. 2, 1999. the entire disclosure of which is hereby incorporated by reference herein. Through-hole 320 is then filled with a suitable metal 370, such as W. A second metal layer is then deposited on second dielectric layer 330 and patterned to form a second metal feature 340 comprising first metal layer 342, e.g., Ti or W, primary intermediate metal layer 344, e.g., Al or an Al alloy, and an upper anti-reflective coating 346, such as Ti—TiN. The second metal feature 340 is electrically connected to the first metal feature 300 by a 360 comprising TiN layer 350 and W plug 370.

The present invention is applicable to the production of various types of semiconductor devices, particularly high density, multi-metal layer semiconductor devices, with submicron features of 0.25 microns and below, exhibiting high speed characteristics and improved interconnection reliability. The present invention is cost effective and can easily be integrated into conventional processing.

In carrying out the embodiments of the present invention, the metal layers, particularly the intermediate layer, can be formed of any metal typically employed in manufacturing semiconductor devices, such as Al, Al alloys, copper, copper alloys, gold, gold alloys, silver, silver alloys, refractory metals, refractory metal alloys, and refractory metal compounds. The metal layers of the present invention can be formed by any technique conventionally employed in the manufacture of semiconductor devices. For example, the metal layers can be formed by conventional metallization techniques, such as various types of CVD processes, including low pressure chemical vapor deposition (LPCVD), and plasma enhanced chemical vapor deposition (PECVD). Normally, when high melting metal point metals such as tungsten are deposited, CVD techniques are employed. Low melting point metals, such as Al and Al alloys, including aluminum-copper alloys, can also be deposited by melting, sputtering, or physical vapor deposition (PVD).

In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail in order not to unnecessarily obscure the present invention.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing an interconnection structure in a semiconductor device, said method comprising:
   forming a first dielectric layer on a substrate;
   forming a patterned first metal layer having gaps on the first dielectric layer, wherein the patterned metal layer comprises a first metal feature having a top surface, a bottom surface, and side surfaces tapering inwardly from the top surface to the bottom surface;
   forming second dielectric layer on the patterned first metal layer;
   forming a through-hole in the second dielectric layer;
   filling the through-hole with a second metal layer; and
   forming a second metal feature on the second metal layer, said second metal feature being electrically connected to the first metal feature via the through-hole with the second metal layer.

2. A method of manufacturing a semiconductor device, said method comprising:
   forming a first dielectric layer on a substrate;
   forming a patterned metal layer having gaps on the first dielectric layer, wherein the patterned metal layer comprises a metal feature having a top surface, a bottom surface, and side surfaces tapering inwardly from the top surface to the bottom surface; and
   forming second dielectric layer on the patterned metal layer, wherein the patterned metal layer is formed by:
   depositing a lower metal layer;
   depositing an intermediate layer of aluminum or an aluminum alloy;
   depositing an upper anti-reflective coating;
   etching to pattern the metal layer forming a plurality of gaps; and
   filling the gaps with a dielectric material.

3. The method of claim 2, comprising controlling an amount of polymer formation during etching to control the slope of the inwardly tapering side surfaces.

4. The method of claim 3, comprising plasma etching the metal layer in the presence of an additive and controlling the amount of polymer formation by controlling the amount of the additive.

5. The method of claim 4, comprising etching with a $Cl_2$—$BCl_3$ plasma containing at least one additive elected from the group consisting of N, $CHF_3$, $CF_4$, $SF_6$, and HCl.

6. The method of claim 5, comprising controlling the amount of polymer formation by reducing the amount of additive to about 5%–10% of the rate of flow.

7. The method of claim 2, wherein the side surfaces taper inwardly at a slope of about 80° to about 89° with respect to a line perpendicular to an upper surface of the first dielectric layer.

8. The method of claim 7, wherein the slope is about 85° to about 88°.

9. The method of claim 7, wherein the slope is about 81° to about 86°.

10. The method of claim 2, wherein the top surface has a width of about 0.54 μm to about 0.56 μm and the bottom surface has a width of about 0.44 μm to about 0.46 μm.

11. The method of claim 2, wherein the top surface has a width that exceeds a width of the bottom surface by at least 0.04 μm.

12. The method of claim 11, wherein the width of the top surface exceeds the width of the bottom surface by at least 0.08 μm.

13. The method of claim 2, wherein the bottom surface as a width of at least about 0.1 μm.

14. The method of claim 2, comprising filling the gaps with a spin-on glass (SOG).

15. The method of claim 2, comprising filling the gaps with hydrogen silsesquioxane (HSQ).

16. The method of claim 2, comprising:
   etching to form a through-hole having an internal surface in the second dielectric layer and expose a portion of the top of the metal feature; and
   depositing a layer of barrier material to line the internal surface of the through-hole.

17. The method of claim 16, comprising depositing the layer of barrier material by chemical vapor deposition.

18. The method of claim 16, comprising depositing the later of barrier material by sputtering.

19. The method of claim 16, wherein the lower metal layer comprises titanium or tungsten; and the anti-reflective coating comprises titanium-titanium nitride.

20. The method of claim 19, comprising filling the through-hole with a conductive material to form a via.

21. The method of claim 20, wherein the conductive material comprises tungsten.

22. The method of claim 16, comprising forming a second patterned metal layer on the second dielectric layer, wherein the second patterned metal layer comprises a second metal feature electrically connected to the metal feature through the via.

* * * * *